(12) United States Patent
Parekh et al.

(10) Patent No.: US 12,538,821 B2
(45) Date of Patent: Jan. 27, 2026

(54) SIGNAL ROUTING STRUCTURES INCLUDING A PLURALITY OF PARALLEL CONDUCTIVE LINES AND SEMICONDUCTOR DEVICE ASSEMBLIES INCLUDING THE SAME

(71) Applicant: Micron Technology, Inc., Boise, ID (US)

(72) Inventors: Kunal R. Parekh, Boise, ID (US);
James B. Johnson, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 470 days.

(21) Appl. No.: 18/096,458

(22) Filed: Jan. 12, 2023

(65) Prior Publication Data
US 2023/0268351 A1    Aug. 24, 2023

Related U.S. Application Data

(60) Provisional application No. 63/303,490, filed on Jan. 26, 2022.

(51) Int. Cl.
*H01L 23/538*    (2006.01)

(52) U.S. Cl.
CPC ...... *H01L 23/5386* (2013.01); *H01L 23/5382* (2013.01); *H01L 23/5383* (2013.01); *H01L 23/5384* (2013.01)

(58) Field of Classification Search
CPC ............. H01L 23/5386; H01L 23/5382; H01L 23/5383; H01L 23/5384; H01L 23/538
See application file for complete search history.

(56) References Cited

U.S. PATENT DOCUMENTS

2011/0115082 A1*  5/2011  Gluschenkov .... H01L 23/49827
                                                           257/738

* cited by examiner

*Primary Examiner* — Peter M Albrecht
(74) *Attorney, Agent, or Firm* — Dorsey & Whitney LLP

(57) ABSTRACT

A semiconductor device assembly includes a first semiconductor device having a first plurality of electrical contacts with a first average pitch, a second semiconductor device over the first semiconductor device and having a second plurality of electrical contacts with a second average pitch, and a signal routing structure between the first and second semiconductor devices and including a first plurality of conductive structures, each in contact with one of the first plurality of electrical contacts, a second plurality of conductive structures, each in contact with one of the second plurality of electrical contacts, and a pattern of parallel conductive lines between the first and second pluralities of conductive structures. The pattern of parallel conductive lines has a third average pitch less than the first and second average pitches, and pairs of conductive structures from the first and second pluralities are electrically coupled by different ones of the parallel conductive lines.

20 Claims, 6 Drawing Sheets

Figure 2
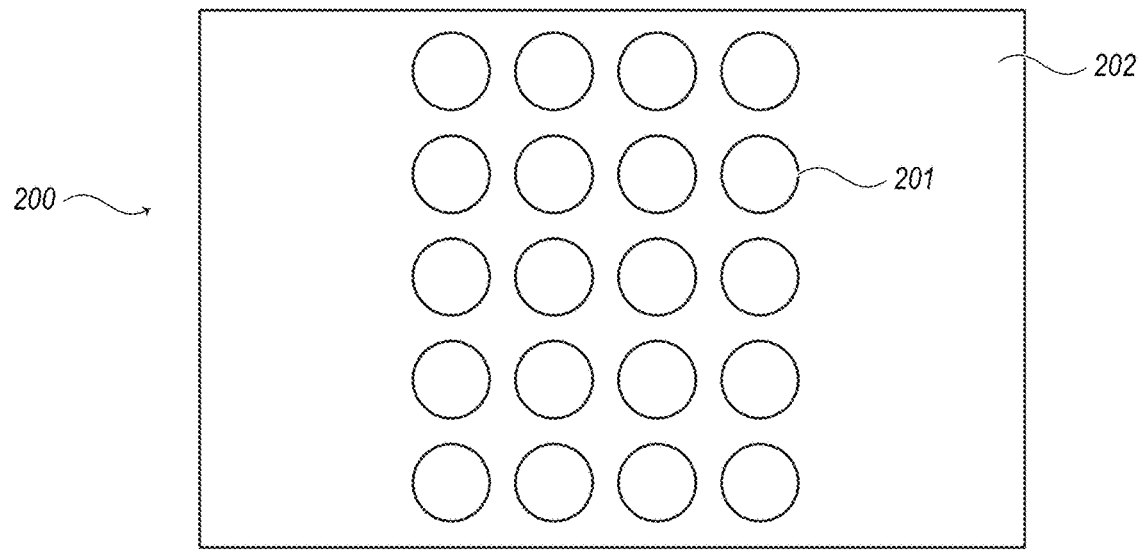
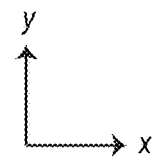
Figure 3
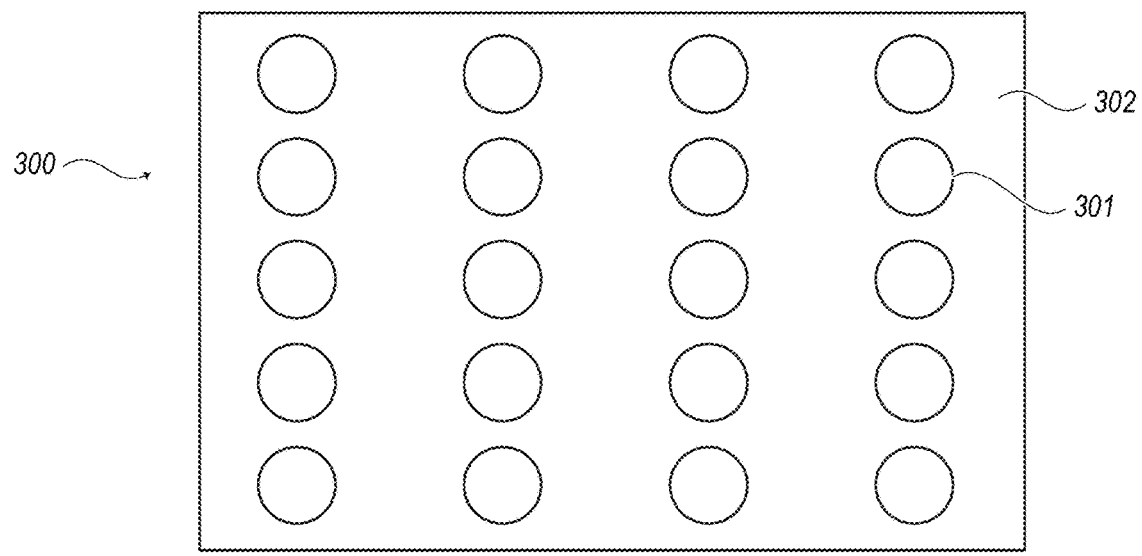

SIGNAL ROUTING STRUCTURES INCLUDING A PLURALITY OF PARALLEL CONDUCTIVE LINES AND SEMICONDUCTOR DEVICE ASSEMBLIES INCLUDING THE SAME

CROSS-REFERENCE TO RELATED APPLICATION(S)

The present application claims priority to U.S. Provisional Patent Application No. 63/303,490, filed Jan. 26, 2022, the disclosure of which is incorporated herein by reference in its entirety.

TECHNICAL FIELD

The present disclosure generally relates to semiconductor device assemblies, and more particularly relates to signal routing structures including a plurality of parallel conductive lines and semiconductor device assemblies including the same.

BACKGROUND

Microelectronic devices generally have a die (i.e., a chip) that includes integrated circuitry with a high density of very small components. Typically, dies include an array of very small bond pads electrically coupled to the integrated circuitry. The bond pads are external electrical contacts through which the supply voltage, signals, etc., are transmitted to and from the integrated circuitry. After dies are formed, they are "packaged" to couple the bond pads to a larger array of electrical terminals that can be more easily coupled to the various power supply lines, signal lines, and ground lines. Conventional processes for packaging dies include electrically coupling the bond pads on the dies to an array of leads, ball pads, or other types of electrical terminals, and encapsulating the dies to protect them from environmental factors (e.g., moisture, particulates, static electricity, and physical impact).

BRIEF DESCRIPTION OF THE DRAWINGS

FIGS. 2 and 3 are simplified schematic planar views of semiconductor devices each having a plurality of electrical contacts with different average pitches in accordance with one aspect of the present disclosure.

DETAILED DESCRIPTION

Specific details of several embodiments of semiconductor devices, and associated systems and methods, are described below. A person skilled in the relevant art will recognize that suitable stages of the methods described herein can be performed at the wafer level or at the die level. Therefore, depending upon the context in which it is used, the term "substrate" can refer to a wafer-level substrate or to a singulated, die-level substrate. Furthermore, unless the context indicates otherwise, structures disclosed herein can be formed using conventional semiconductor-manufacturing techniques. Materials can be deposited, for example, using chemical vapor deposition, physical vapor deposition, atomic layer deposition, plating, electroless plating, spin coating, and/or other suitable techniques. Similarly, materials can be removed, for example, using plasma etching, wet etching, chemical-mechanical planarization, or other suitable techniques.

Some semiconductor device assemblies can involve the electrical integration of semiconductor devices (e.g., dies) with a variety of functions and device layout. The challenge of such heterogenous assembly integration can involve electrically connecting semiconductor devices with different layouts of contacts (e.g., pillars, pads, pins, etc.), some of which may have different sizes, pitches, etc. To facilitate the connection of these varying contact schemes, intermediate structures such as interposers, remote distribution layers (RDLs), etc. can be provided between devices with different contact and/or pad layouts. These intermediate structures can increase the cost and complexity of the package integration, especially given how many different contact and/or pad layouts may need to be variously combined into different packages—the number of designs for the intermediate structures may be nearly limitless. Because these intermediate structures are fabricated in advance of the package integration, design, fabrication, inventory control, and other similar concerns for the virtually innumerable intermediate structures can present significant challenges for a manufacturer or integrator.

To address these drawbacks and others, various embodiments of the present application provide semiconductor device assemblies in which a signal routing structure can be easily customized during package integration using straightforward processing techniques (e.g., masking, etching, plating, dielectric layer formation, via formation, etc.) to provide electrical interconnection between adjacent semiconductor devices with different contact layout schemes. Additional benefits of the disclosed signal routing structures include their relative thinness when compared to other interconnection structures, contributing little to overall assembly height, and their compatibility with high-throughput and low- or zero bond line thickness attachment techniques, such as hybrid bonding.

Figure 1A:
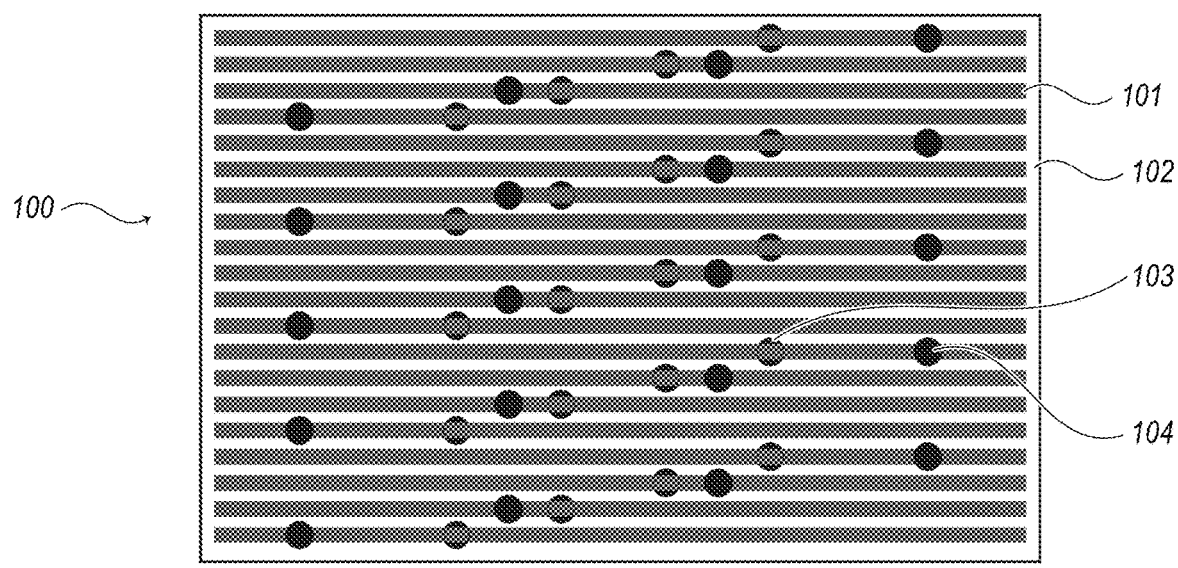
FIGS. 1A and 1B are simplified schematic planar and cross-sectional views, respectively, of a signal routing structure in accordance with one embodiment of the present disclosure.
Figure 1B:
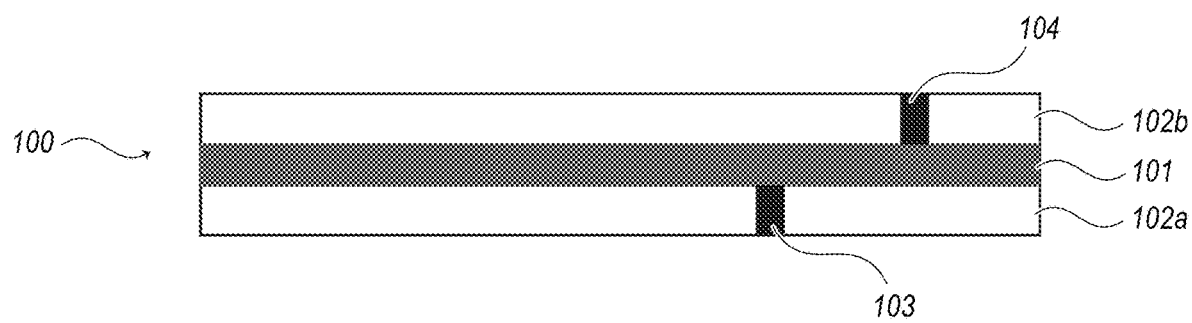

In this regard, FIGS. 1A and 1B are simplified schematic planar and cross-sectional views, respectively, of a signal routing structure 100 in accordance with one embodiment of the present disclosure. Signal routing structure 100 includes a plurality of parallel conductive lines, such as conductive line 101, disposed within an intermediate region of a layer of dielectric material 102. In a lower region 102a of the layer of dielectric material 102 are disposed conductive structures 103 (e.g., vias), each in physical and electrical contact with a corresponding one of the plurality of parallel conductive lines 101. In an upper region 102b of the layer of dielectric material 102 are disposed conductive structures 104 (e.g., vias), each in physical and electrical contact with a corresponding one of the plurality of parallel conductive lines 101. With this arrangement, pairs of corresponding conductive structures 103 and 104 are electrically connected to each other through a corresponding one of the plurality of conductive lines 101.

In accordance with one aspect of the present disclosure, the plurality of conductive lines 101 can be plated metal (e.g., copper, aluminum, alloys thereof, etc.) traces formed in the layer of dielectric material 102 according to well-known techniques (e.g., masking, patterning, etching, disposing a seed layer, and plating). This may be facilitated if the upper region 102b of the layer of dielectric material 102 is separately formed over the intermediate region after the conductive lines are formed. In accordance with another aspect of the present disclosure, the conductive structures 103 and 104 in the lower and upper regions 102a and 102b, respectively, of the layer of dielectric material 102 can be conducive metal (e.g., copper, aluminum, alloys thereof, etc.) vias formed according to well-known techniques for via formation (e.g., masking, patterning, etching, disposing a seed layer, and plating). Alternatively, conductive structures 103 and 104 can be solder plugs, pre-formed conductive structures attached by solder to the conductive lines 101, or any one of a number of other interconnect structures suitable for connecting a buried trace to another conductive structure through a layer of dielectric material 102 well-known to those skilled in the art.

The foregoing arrangement in which pairs of conductive structures 103 and 104 are electrically connected to each other through one of the plurality of conductive lines 101 permits each pair of conductive structures to be laterally spaced apart from one another, facilitating the routing of electrical signals between devices having contacts with different layouts, sizes, spacing, and/or pitches. In this regard, FIGS. 2 and 3 are simplified schematic planar views of semiconductor devices 200 and 300, each having a plurality of electrical contacts with different average pitches in accordance with one aspect of the present disclosure. As can be see with references to FIG. 2, semiconductor device 200 includes an array of electrical contacts 201 (e.g., conductive pads, pillars, pins, exposed TSV surfaces, etc.) disposed in or on a layer of dielectric material 202. The electrical contacts 201 are spaced by a first average pitch along the x-axis (e.g., the distance along the x-axis between centers of adjacent electrical contacts averaged over the array). Similarly, as can be see with references to FIG. 3, semiconductor device 300 includes an array of electrical contacts 301 (e.g., conductive pads, pillars, pins, exposed TSV surfaces, etc.) disposed in or on a layer of dielectric material 302. The electrical contacts 301 are spaced by a second average pitch along the x-axis different from the first average pitch of the electrical contacts 201 of the semiconductor device 200 of FIG. 2.

To facilitate the connection of each of the electrical contacts 201 of semiconductor device 200 to a corresponding one of the electrical contacts 301 of semiconductor device 300, the signal routing structure can be provided between the semiconductor devices 200 and 300 in a stack, with each corresponding pair of electrical contacts 201 and 301 electrically connected by a corresponding pair of conductive structures 103 and 104 that are each electrically coupled to a single one of the parallel conductive lines 101. This arrangement is illustrated in FIGS. 4A and 4B, which are simplified schematic planar and cross-sectional views, respectively, of a semiconductor device assembly 400 including the signal routing structure 100 of FIGS. 1A and 1B and the semiconductor devices 200 and 300 of FIGS. 2 and 3, in accordance with one embodiment of the present disclosure.

Figure 4A:
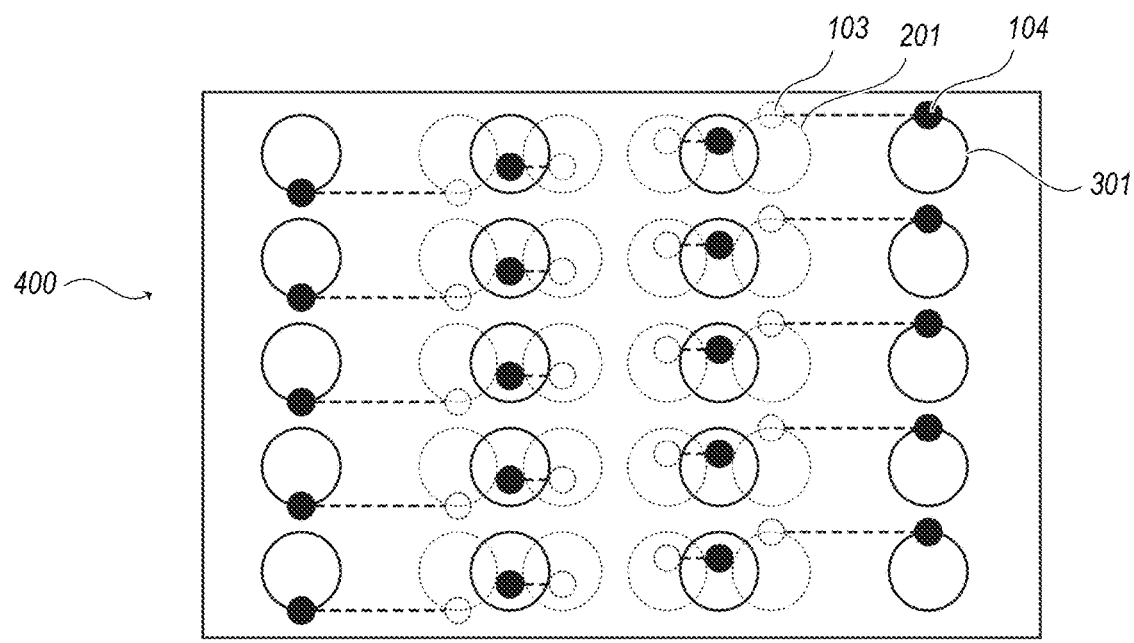
FIGS. 4A and 4B are simplified schematic planar and cross-sectional views, respectively, of a semiconductor device assembly including a signal routing structure in accordance with one embodiment of the present disclosure.

To more clearly illustrate the relative positions of the electrical contacts 201 and 301 and of the conductive structures 103 and 104, the plurality of parallel conductive lines of the signal routing structure 100 have been omitted from the planar view of semiconductor device assembly 400 in FIG. 4A, while the connections provided between corresponding pairs of conductive structures 103 and 104 by the parallel conductive lines have been schematically indicated by dashed lines. As can be seen with reference to FIG. 4A, the conductive structures 103 in the lower region 102a of dielectric layer 102 and the electrical contacts 201 of semiconductor device 200 have been illustrated in broken lines, while the conductive structures 104 in the upper region 102b of dielectric layer 102 and the electrical contacts 301 of semiconductor device 300 have been illustrated with solid lines. Because of the tight pitch of the parallel conductive lines and the small size of the conductive structures 103 and 104, relative to the electrical contacts 201 and 301, each row of conductive structures overlies a plurality of the parallel conductive lines and can accordingly be connected into corresponding pairs by a signal routing structure with only a single layer of metallization (e.g., in the intermediate layer of the dielectric material).

Figure 4B:
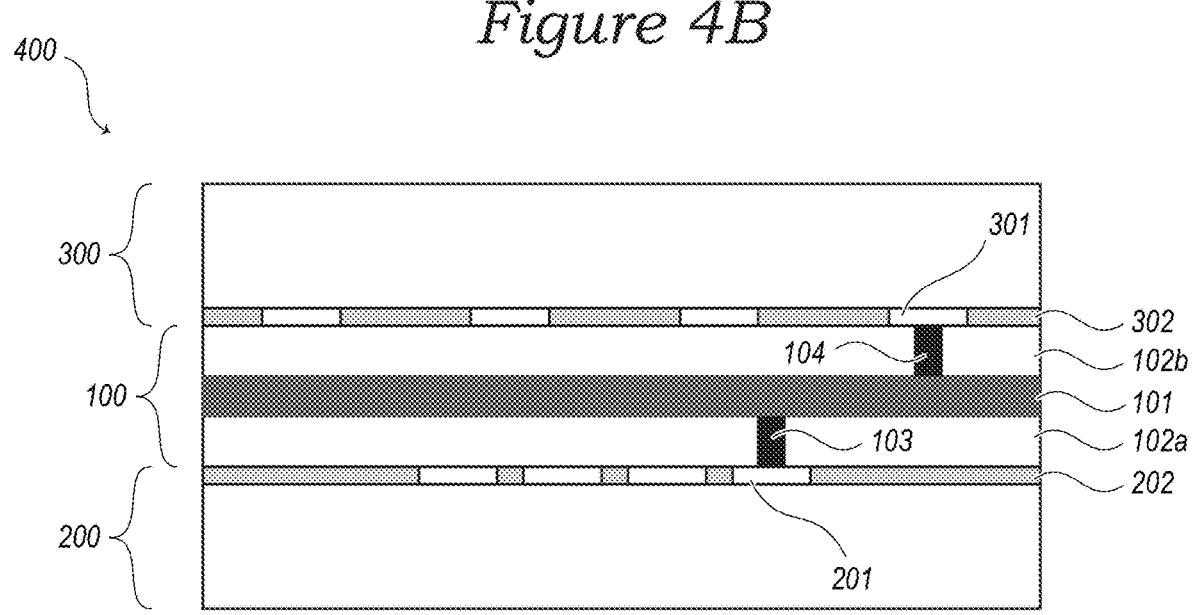

Turning to FIG. 4B, the semiconductor device assembly 400 is illustrated in cross-section, to more clearly illustrate the connectivity between corresponding pairs of electrical contacts 201 and 301 provided by the parallel conductive lines 101 of the signal routing structure 100. As set forth above, a single layer of metallization (e.g., in the intermediate layer of the dielectric material 102) is sufficient to provide connectivity between contact arrays having different average pitches (e.g., in which at least some corresponding pairs of electrical contacts 201 and 301 are not in vertical alignment or vertically overlapping). In accordance with one aspect of the present disclosure, stacking semiconductor devices 200 and 300 with the signal routing structure 100 can be accomplished through a hybrid bonding process, in which pressure and heat are provided to form dielectric-dielectric bonds between the dielectric layers 202 and 302 of the semiconductor devices 200 and 300 and the dielectric layer 102 of the signal routing structure 100 simultaneously with metal-metal bonds between the conductive structures 103 and 104 and the electrical contacts 201 and 301. In other embodiments, other attachment methods may alternatively be used (e.g., solder interconnects connecting electrical contacts to conductive structures, with optional layers of underfill or thermal interface material (TIM) or other adhesives).

Although in the foregoing example embodiments semiconductor devices are illustrated and described with contact arrays in which the average pitch differs in only one dimension, in other embodiments signal routing structures can be configured to provide connectivity between semiconductor devices in which contact arrays have different average pitches in multiple dimensions. Similarly, although in the foregoing example embodiments semiconductor devices are illustrated and described with contact arrays in which the size of the electrical contacts is the same for different devices, in other embodiments signal routing structures can be configured to provide connectivity between semiconductor devices in which electrical contacts of different sizes are provided.

According to one aspect of the present disclosure, the ratio of the pitch of the plurality of parallel lines to the size of an electrical contacts of a semiconductor device may determine how many electrical contacts in a row parallel to the conductive line may be coupled to corresponding electrical contacts of another device by a signal routing structure in which the plurality of parallel conductive lines are continuous (e.g., in the illustrated embodiment, in which the ratio is about 1:4, a row of four electrical contacts can be accommodated). In some embodiments of the present disclosure, a signal routing structure may be configured with non-continuous parallel conductive lines to accommodate even larger rows of electrical contacts. In this regard, FIG. 5 provides a simplified schematic planar view of a semiconductor device assembly that includes a signal routing structure with non-continuous parallel conductive lines in accordance with another embodiment of the present disclosure.

Figure 5:
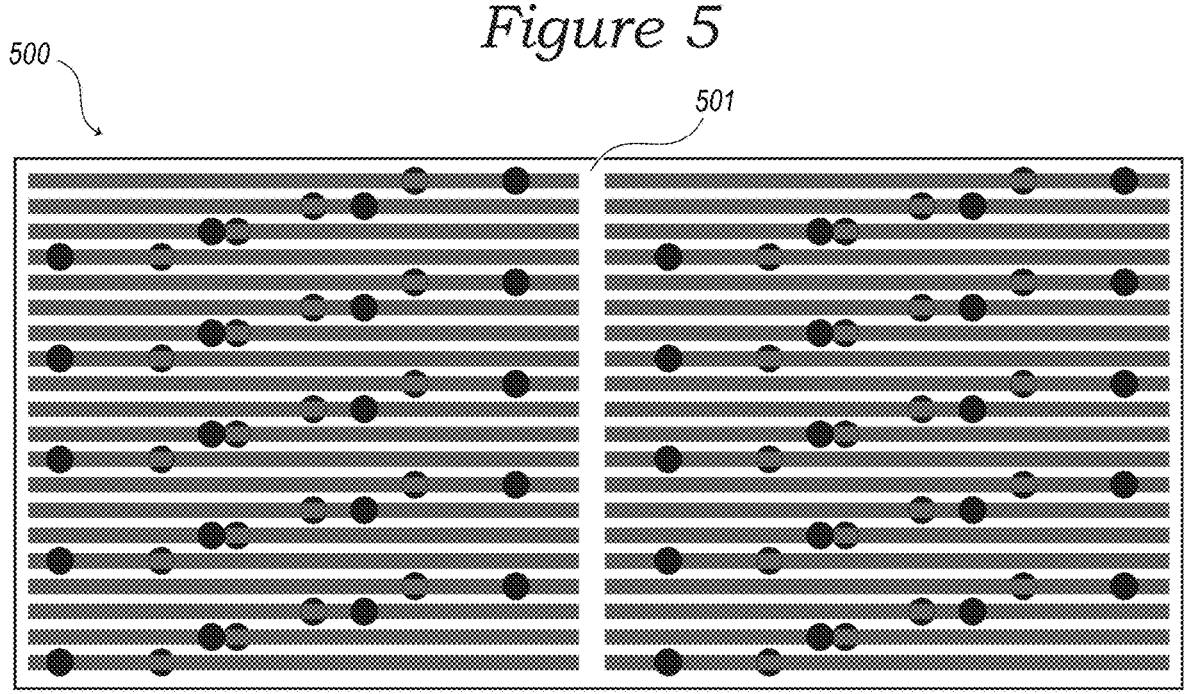
FIG. 5 is a simplified schematic planar view of a semiconductor device assembly including a signal routing structure in accordance with another embodiment of the present disclosure.

As can be seen with reference to FIG. 5, signal routing structure 500 includes similar structures to that of signal routing structure 100 illustrated in FIG. 1, with the notable difference that a region 501 free from parallel conductive lines is provided. This region 501 permits the plurality of conductive lines to be non-continuous, and accordingly accommodate larger arrays of electrical contacts than could be accommodated without either shrinking the pitch of the conductive lines (e.g., to reduce the ratio of line pitch to pad width, as set forth in greater detail above) or increasing the number of metallization layers, and accordingly the cost and complexity of the signal routing structure 500. In one embodiment, the region 501 could be provided during the manufacture of the signal routing structure 500 (e.g., by merely not plating lines in the region 501). In yet another embodiment, however, non-continuity of the plurality of parallel conductive lines may be provided with a greater degree of design freedom and configurability by including one or more fuses and/or anti-fuses in each conductive line. As will be readily appreciated by those skilled in the art, by either blowing fuses to separate a single line into multiples, or not blowing anti-fuses to join multiple lines into a single line, a single design of a signal routing structure can be used with a variety of semiconductor devices with different pad array configurations.

Figure 6:
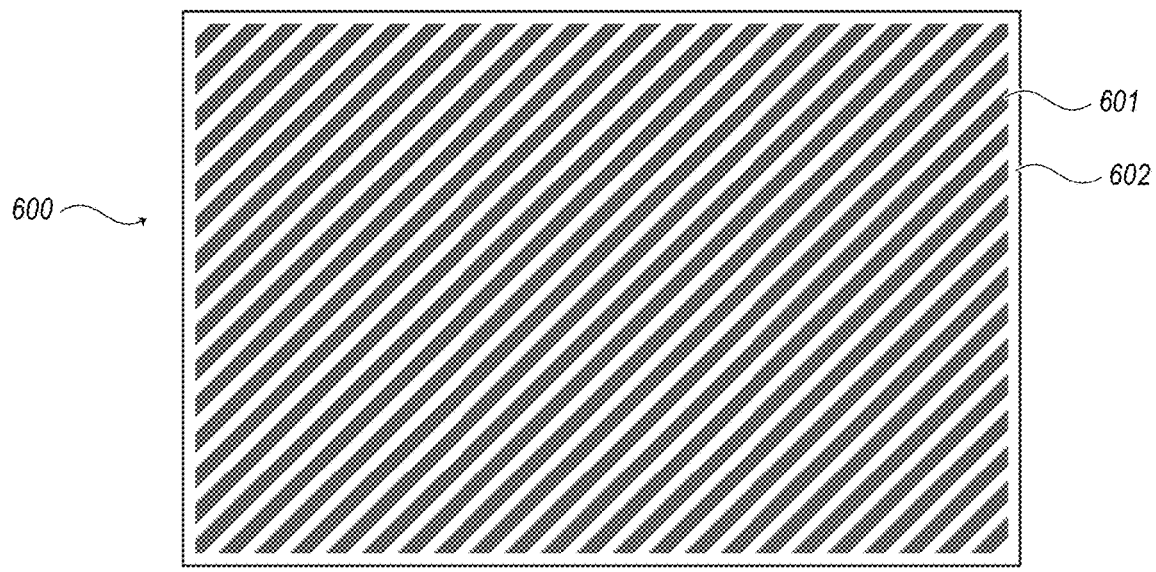
FIG. 6 is a simplified schematic planar view of a signal routing structure in accordance with another embodiment of the present disclosure.

Although in the foregoing example embodiments signal routing structures are illustrated and described with a plurality of parallel conductive lines which have s major axis parallel to a major axis of the array of electrical contacts of a semiconductor device to which the signal routing structure is configured to be attached, in other embodiments of the present disclosure a signal routing structure may include a plurality of parallel conductive lines having a major axis at any arbitrary angle, which for some assemblies may better facilitate connection between different contact layouts. FIG. 6 shows one such example embodiment of a signal routing structure 600 in which a plurality of parallel conductive lines 601 are provided in or on a layer of dielectric material at a non-right angle with respect to the edges of the structure 600. According to various aspects of the present disclosure, such an arrangement can be accomplished by singulating a larger signal routing structure at an angle with respect to the plurality of parallel conductive lines, or by plating the lines at the desired angle with respect to the intended (e.g., pre-singulated) edges of the structure.

As will be readily understood by those of skill in the art, although the foregoing examples are illustrated with semiconductor device assemblies in which two devices are stacked with a signal routing structure therebetween, embodiments of the present disclosure contemplate larger stacks with greater numbers of semiconductor devices, with more than one adjacent pair of semiconductor devices connected as set forth above by a signal routing structure.

Figure 7:
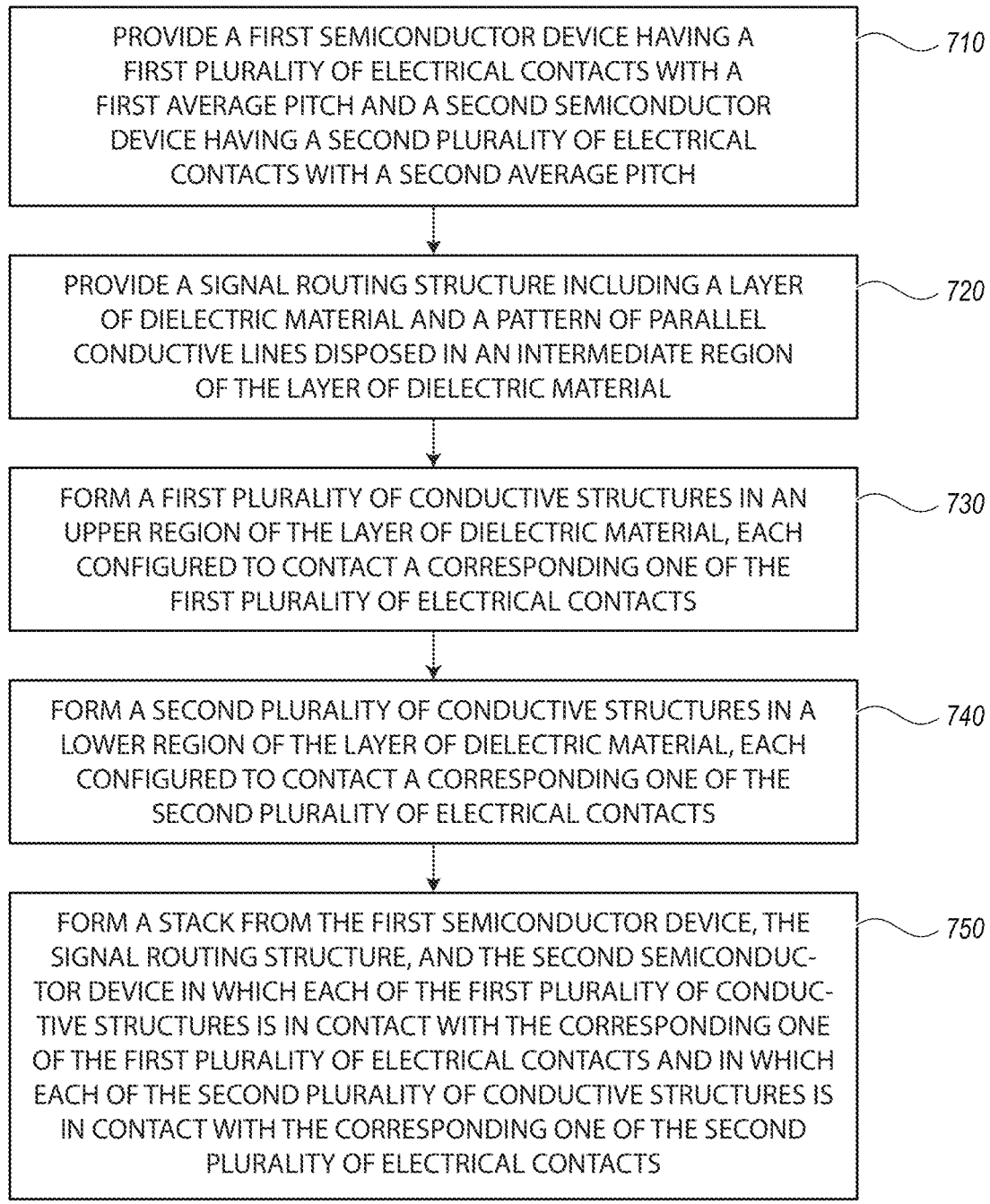
FIG. 7 is a flow chart illustrating a method of making a semiconductor device assembly in accordance with an embodiment of the present technology.

FIG. 7 is a flow chart illustrating a method of making a semiconductor device assembly. The method includes providing a first semiconductor device having a first plurality of electrical contacts with a first average pitch and a second semiconductor device having a second plurality of electrical contacts with a second average pitch (box 710) and providing a signal routing structure including a layer of dielectric material and a pattern of parallel conductive lines disposed in an intermediate region of the layer of dielectric material (box 720). The method further comprises forming a first plurality of conductive structures in an upper region of the layer of dielectric material, each configured to contact a corresponding one of the first plurality of electrical contacts (box 730) and forming a second plurality of conductive structures in a lower region of the layer of dielectric material, each configured to contact a corresponding one of the second plurality of electrical contacts. The method further comprises forming a stack from the first semiconductor device, the signal routing structure, and the second semiconductor device in which each of the first plurality of conductive structures is in contact with the corresponding one of the first plurality of electrical contacts and in which each of the second plurality of conductive structures is in contact with the corresponding one of the second plurality of electrical contacts (box 750). In accordance with one aspect of the present disclosure, corresponding pairs of conductive structures from the first and second pluralities of conductive structures are electrically coupled by different ones of the plurality of parallel conductive lines and wherein the pattern of parallel conductive lines has a third average pitch less than both the first and second average pitches.

Figure 8:
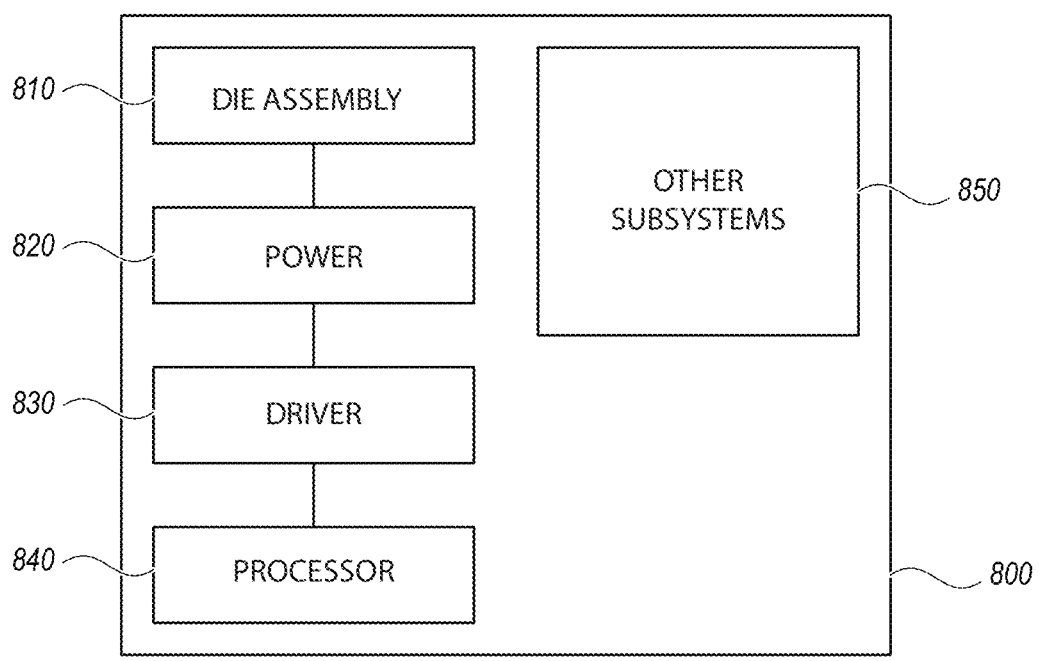
FIG. 8 is a schematic view showing a system that includes a semiconductor device assembly configured in accordance with an embodiment of the present technology.

Any one of the semiconductor devices and semiconductor device assemblies described above can be incorporated into any of a myriad of larger and/or more complex systems, a representative example of which is system 800 shown schematically in FIG. 8. The system 800 can include a semiconductor device assembly (e.g., or a discrete semiconductor device) 802, a power source 804, a driver 806, a processor 808, and/or other subsystems or components 810. The semiconductor device assembly 802 can include features generally similar to those of the semiconductor devices described above. The resulting system 800 can perform any of a wide variety of functions, such as memory storage, data processing, and/or other suitable functions. Accordingly, representative systems 800 can include, without limitation, hand-held devices (e.g., mobile phones, tablets, digital readers, and digital audio players), computers, vehicles, appliances and other products. Components of the system 800 may be housed in a single unit or distributed over multiple, interconnected units (e.g., through a communications network). The components of the system 800 can also include remote devices and any of a wide variety of computer readable media.

In accordance with one aspect of the present disclosure, the semiconductor device assemblies illustrated and described above could include memory dies, such as dynamic random access memory (DRAM) dies, NOT-AND (NAND) memory dies, NOT-OR (NOR) memory dies, magnetic random access memory (MRAM) dies, phase change memory (PCM) dies, ferroelectric random access memory (FeRAM) dies, static random access memory (SRAM) dies, or the like. In an embodiment in which multiple dies are provided in a single assembly, the semiconductor devices could be memory dies of a same kind (e.g., both NAND, both DRAM, etc.) or memory dies of different kinds (e.g., one DRAM and one NAND, etc.). In accordance with another aspect of the present disclosure, the semiconductor dies of the assemblies illustrated and described above could include logic dies (e.g., controller dies, processor dies, etc.), or a mix of logic and memory dies (e.g., a memory controller die and a memory die controlled thereby).

The devices discussed herein, including a memory device, may be formed on a semiconductor substrate or die, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

The functions described herein may be implemented in hardware, software executed by a processor, firmware, or any combination thereof. Other examples and implementations are within the scope of the disclosure and appended claims. Features implementing functions may also be physically located at various positions, including being distributed such that portions of functions are implemented at different physical locations.

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

As used herein, the terms "vertical," "lateral," "upper," "lower," "above," and "below" can refer to relative directions or positions of features in the semiconductor devices in view of the orientation shown in the Figures. For example, "upper" or "uppermost" can refer to a feature positioned closer to the top of a page than another feature. These terms, however, should be construed broadly to include semiconductor devices having other orientations, such as inverted or inclined orientations where top/bottom, over/under, above/below, up/down, and left/right can be interchanged depending on the orientation.

It should be noted that the methods described above describe possible implementations, and that the operations and the steps may be rearranged or otherwise modified and that other implementations are possible. Furthermore, embodiments from two or more of the methods may be combined.

From the foregoing, it will be appreciated that specific embodiments of the invention have been described herein for purposes of illustration, but that various modifications may be made without deviating from the scope of the invention. Rather, in the foregoing description, numerous specific details are discussed to provide a thorough and enabling description for embodiments of the present technology. One skilled in the relevant art, however, will recognize that the disclosure can be practiced without one or more of the specific details. In other instances, well-known structures or operations often associated with memory systems and devices are not shown, or are not described in detail, to avoid obscuring other aspects of the technology. In general, it should be understood that various other devices, systems, and methods in addition to those specific embodiments disclosed herein may be within the scope of the present technology.

What is claimed is:

1. A semiconductor device assembly, comprising:
a first semiconductor device having a first plurality of electrical contacts with a first average pitch;
a second semiconductor device disposed over the first semiconductor device and having a second plurality of electrical contacts with a second average pitch;
and a signal routing structure disposed between the first and second semiconductor devices, the signal routing structure comprising:
a first plurality of conductive structures, each in contact with a corresponding one of the first plurality of electrical contacts, a second plurality of conductive structures, each in contact with a corresponding one of the second plurality of electrical contacts, and
a pattern of parallel conductive lines disposed between the first and second pluralities of conductive structures, the pattern of parallel conductive lines having a third average pitch less than both the first and second average pitches, wherein corresponding pairs of conductive structures from the first and second pluralities of conductive structures are electrically coupled by different ones of the plurality of parallel conductive lines.

2. The semiconductor device assembly of claim 1, wherein the parallel conductive lines are disposed in a layer of dielectric material through which the first and second pluralities of conductive structures extend.

3. The semiconductor device assembly of claim 1, wherein the parallel conductive lines are metal traces.

4. The semiconductor device assembly of claim 1, wherein the parallel conductive lines of the pattern each have a same trace width.

5. The semiconductor device assembly of claim 1, wherein both the first and second average pitches are more than double the third average pitch.

6. The semiconductor device assembly of claim 1, wherein the first average pitch is greater than the second average pitch.

7. The semiconductor device assembly of claim 1, wherein the third average pitch is less than a width of one of the first plurality of electrical contacts.

8. The semiconductor device assembly of claim 1, wherein each of the first plurality of electrical contacts has a larger cross-sectional area than each of the second plurality of electrical contacts.

9. The semiconductor device assembly of claim 1, wherein each of the first plurality of conductive structures has a smaller cross-sectional area than a corresponding one of the first plurality of electrical contacts, and wherein each of the second plurality of conductive structures has a smaller cross-sectional area than a corresponding one of the second plurality of electrical contacts.

10. The semiconductor device assembly of claim 1, wherein the corresponding pairs of conductive structures are laterally offset from one another such that they are not vertically aligned.

11. A signal routing structure, comprising:
a layer of dielectric material;
a first plurality of conductive structures with a first average pitch disposed in an upper region of the layer of dielectric material, each having an exposed upper surface;
a second plurality of conductive structures with a second average pitch in a lower region of the layer of dielectric material, each having an exposed lower surface; and
a pattern of parallel conductive lines disposed in an intermediate region of the layer of dielectric material between the first and second pluralities of conductive structures, the pattern of parallel conductive lines having a third average pitch less than both the first and second average pitches, wherein corresponding pairs of conductive structures from the first and second pluralities of conductive structures are electrically coupled by different ones of the plurality of parallel conductive lines.

12. The signal routing structure of claim 11, wherein the corresponding pairs of conductive structures are laterally offset from one another such that they are not vertically aligned.

13. The signal routing structure of claim 11, wherein the parallel conductive lines are metal traces.

14. The signal routing structure of claim 11, wherein the parallel conductive lines of the pattern each have a same trace width.

15. The signal routing structure of claim 11, wherein both the first and second average pitches are more than double the third average pitch.

16. The signal routing structure of claim 11, wherein the first average pitch is greater than the second average pitch.

17. A method of forming a semiconductor device assembly, comprising:
providing a first semiconductor device having a first plurality of electrical contacts with a first average pitch and a second semiconductor device having a second plurality of electrical contacts with a second average pitch;
providing a signal routing structure including a layer of dielectric material and a pattern of parallel conductive lines disposed in an intermediate region of the layer of dielectric material;
forming a first plurality of conductive structures in an upper region of the layer of dielectric material, each configured to contact a corresponding one of the first plurality of electrical contacts;
forming a second plurality of conductive structures in a lower region of the layer of dielectric material, each configured to contact a corresponding one of the second plurality of electrical contacts; and
forming a stack from the first semiconductor device, the signal routing structure, and the second semiconductor device in which each of the first plurality of conductive structures is in contact with the corresponding one of the first plurality of electrical contacts and in which each of the second plurality of conductive structures is in contact with the corresponding one of the second plurality of electrical contacts, wherein corresponding pairs of conductive structures from the first and second pluralities of conductive structures are electrically coupled by different ones of the plurality of parallel conductive lines and wherein the pattern of parallel conductive lines has a third average pitch less than both the first and second average pitches.

18. The method of claim 17, wherein forming the first and second plurality of conductive structures comprises etching openings in the dielectric material and plating a conductive material therein.

19. The method of claim 17, wherein forming the stack comprises forming dielectric-dielectric bonds between corresponding facing surfaces of the first semiconductor device, the signal routing structure, and the second semiconductor device.

20. The method of claim 17, wherein forming the stack comprises forming metal-metal bonds between corresponding ones of the first plurality of conductive structures and of the first plurality of electrical contacts, and between corresponding ones of the second plurality of conductive structures and of the second plurality of electrical contacts.

* * * * *